(12) United States Patent
Peiter et al.

(10) Patent No.: US 6,914,006 B2
(45) Date of Patent: Jul. 5, 2005

(54) WAFER SCRIBING METHOD AND WAFER SCRIBING DEVICE

(75) Inventors: Martin Peiter, Dresden (DE); Eckhard Marx, Radeburg (DE); Karl E. Mautz, Round Rock, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 241 days.

(21) Appl. No.: 10/016,633

(22) Filed: Oct. 30, 2001

(65) Prior Publication Data

US 2003/0109141 A1 Jun. 12, 2003

(51) Int. Cl.$^7$ ............................................. H01L 21/302
(52) U.S. Cl. ..................... 438/707; 438/708; 438/713; 438/715; 438/719
(58) Field of Search ............................... 438/707, 708, 438/713, 715, 719

(56) References Cited

U.S. PATENT DOCUMENTS

| | | | |
|---|---|---|---|
| 4,044,222 A * | 8/1977 | Kestenbaum | 219/121.71 |
| 5,597,590 A * | 1/1997 | Tanimoto et al. | 425/174.4 |
| 5,733,711 A | 3/1998 | Juengling | |
| 5,877,064 A | 3/1999 | Chang | |
| 6,063,695 A | 5/2000 | Lin | |
| 6,156,676 A * | 12/2000 | Sato et al. | 438/798 |
| 6,214,703 B1 * | 4/2001 | Chen et al. | 438/462 |
| 6,248,973 B1 | 6/2001 | Matsumura | |
| 6,261,382 B1 | 7/2001 | Marx | |
| 6,340,806 B1 * | 1/2002 | Smart et al. | 219/121.62 |

FOREIGN PATENT DOCUMENTS

| | | |
|---|---|---|
| JP | 57113242 | 7/1982 |
| JP | 08045801 | 2/1996 |
| JP | 10106905 | 4/1998 |
| JP | 11028593 | 2/1999 |
| JP | 2000042763 | 2/2000 |
| JP | 2001138076 | 5/2001 |

OTHER PUBLICATIONS

International Search Report (PCT/US02/31903).

* cited by examiner

Primary Examiner—Duy-Vu Deo
Assistant Examiner—Binh X. Tran
(74) Attorney, Agent, or Firm—James L. Clingan, Jr.

(57) ABSTRACT

The present invention relates to a scribing method for wafers (11), wherein a defined beam (12) is directed onto the wafer (11) by means of a beam generator means (10) so as to remove some wafer material from a wafer region. The invention also relates to a wafer-scribing device including a wafer mount (31) and a beam generator means (10) by means of which at least one defined beam can be directed onto the wafer (11).

The inventive method is distinguished by the by the further step of generating a first radiation pulse having a predeterminable energy density and used to create a comparatively deep pit (18) in the wafer (11).

The inventive wafer scribing means is distinguished by the provision that a radiation pulse can be generated by means of which a comparatively deep pit (18) can be created in the wafer (11).

4 Claims, 3 Drawing Sheets

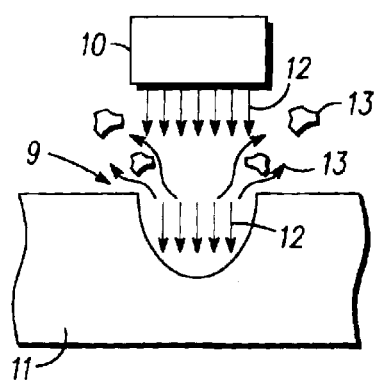
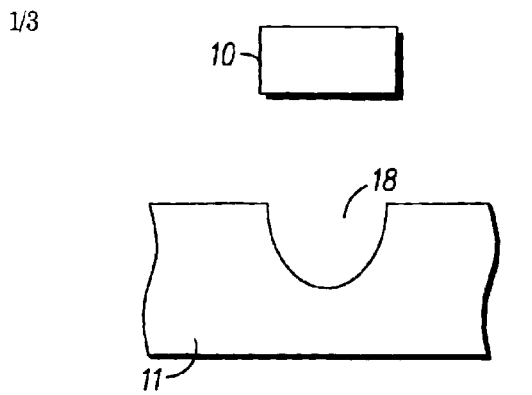
FIG. 1A
FIG. 1B
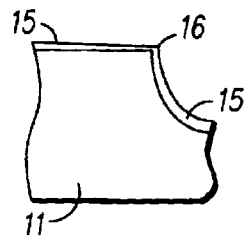
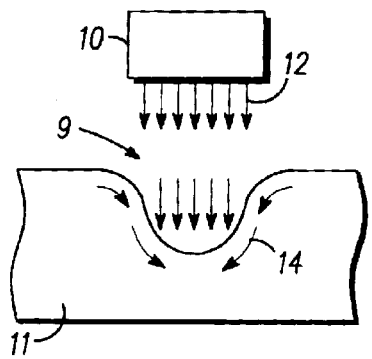
FIG. 1C
FIG. 2A
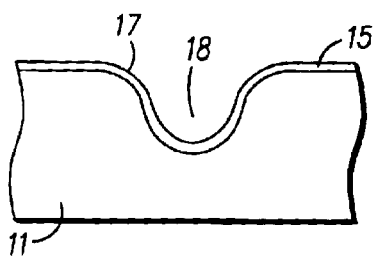
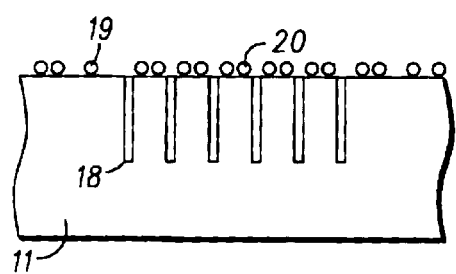
FIG. 2B
FIG. 3A
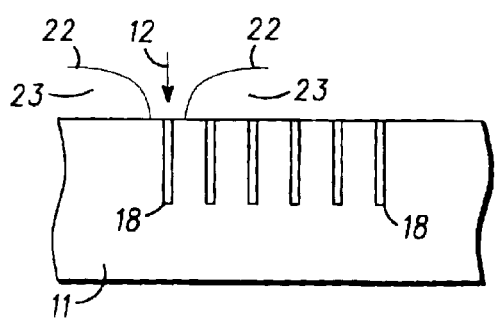
FIG. 3B

WAFER SCRIBING METHOD AND WAFER SCRIBING DEVICE

FIELD OF THE INVENTION

The present invention generally relates to the scribing of wafers and more particularly to a wafer scribing method wherein a defined beam is directed onto the wafer by means of a beam generator means so as to remove some wafer material from a wafer region, and to a wafer scribing device including a wafer mount and a beam generator means by means of which at least one defined beam can be directed onto the wafer.

BACKGROUND OF THE INVENTION

Nowadays the face of wafers is scribed in the manner of some kind of soft mark at a very low depth. Such scribing serves to recognize wafers in the process flow in the manufacture of semiconductor devices such as processors in particular. The reason for using soft marks of a very low depth resides in the fact that a smooth transition between the wafer plane and the pit in the wafer is required in order to achieve a constant resist film layer at the scribing site, too. Whenever this is not the case the reliability of the resist film layer is insufficient, which leads to the result that particles of the material may be released in the subsequent steps of wafer processing and might thus cause trouble in the semiconductor devices. However, the inscribed flat pit is too superficial to survive all the operating steps throughout the manufacture of the devices. For this reason a re-inscription is necessary. Such a re-inscription is firstly a time-consuming operation and secondly it results in impurities in possible devices because some material may be transferred from the scribing region to the device region.

It is for this reason that the present invention seeks to provide a wafer scribing method and a wafer-scribing device which avoid any contamination and the formation of conceivable materials such as metal oxides which could dramatically interfere with or destroy the functionality of devices.

This problem is solved by a wafer scribing method wherein a defined beam is directed onto the wafer by means of a beam generator means, so as to remove some wafer material from a region of the wafer, which method provides the further operating step of generating a first radiation pulse having a predeterminable energy density and used to create a deep pit in the wafer, whereas the pit is deep enough to remain a pit throughout a manufacture of semiconductor devices on said wafer.

The problem is further solved by a wafer scribing method wherein a defined beam is directed onto the wafer by means of a beam generator means, so as to remove some wafer material from a region of the wafer, which method provides the further operating step of generating a first radiation beam having a predeterminable energy density and used to create a deep pit in the wafer, whereas the pit is deep enough to remain a pit throughout a manufacture of semiconductor devices on said wafer, and whereas an edge of the pit is smooth.

The problem is moreover solved by means of a wafer scribing device including a wafer mount and a beam generator means, which serves to render at least one defined beam visible on the wafer, wherein a radiation pulse can be generated by means of which a comparatively deep pit can be created in the wafer, whereas the pit is deep enough to remain a pit throughout a manufacture of semiconductor devices on said wafer.

BRIEF DESCRIPTION OF THE DRAWINGS

The invention will now be described in the following without any restriction of the general inventive idea by exemplary embodiments with reference to the drawings which are referred to expressis verbis as far as the disclosure of all the inventive details is concerned which are not described in more details in the text. In the drawing:

FIG. 1a is a schematic representation of the operation of creating a deep pit in a silicon wafer;

FIG. 1b is a schematic representation like that of FIG. 1a, after the creation of a deep pit;

FIG. 1c is an enlarged view of a detail of the wafer provided with a pit and a resist;

FIG. 2a is a s schematic illustration showing the post-processing of the pit;

FIG. 2b shows the wafer with a pit from FIG. 2a, provided with a resist;

FIG. 3a is a cross-section taken through a wafer including 6 pits and corresponding contamination on the wafer surface;

FIG. 3b is a cross-section taken through a silicon wafer, in which an improvement of the invention is illustrated;

DETAILED DESCRIPTION OF THE PREFERRED EMBODIMENT

Figure 3C:
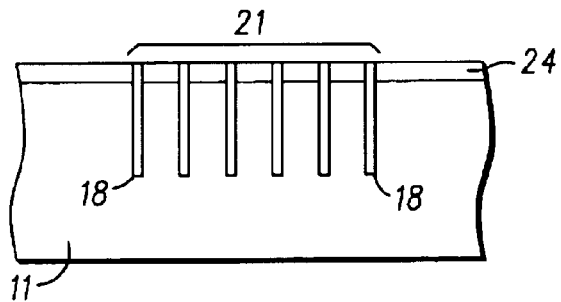
FIG. 3c shows a cross-section taken through a silicon wafer including a sacrificial film applied thereon.

The schematic in FIG. 1a illustrates a method of scribing wafers 11, wherein a beam generator means 10 is employed to direct a defined beam 12 onto the wafer 11 for removal of some wafer material from a region on the wafer 11, wherein moreover the further step of generating a first radiation pulse having a predeterminable energy density is provided which serves to create a comparatively deep pit 18 in the wafer 11, i.e. a pit 18 that is deep enough to remain a pit throughout subsequent manufacturing steps of the wafer 11. Such a pit 18 remains after applying an additional layer upon the wafer. The term "pit" may also be understood to denote a dent or cavity or hole in particular within the scope of the present invention.

FIG. 1b illustrates the wafer 11 with the comparatively deep pit 18 created therein. Due to the inventive process flow it is no longer necessary to perform a so-called re-inscription step so that any lumps of material will substantially not interfere or even lead to destruction in the ongoing production of devices and specifically semiconductor devices. The re-inscription step is highly problematic already for the reason that metals or oxides, respectively, may be spattered over the wafer in particular during this re-inscription step.

Preferably a local plasma is generated for creating the comparatively deep pit, which avoids substantially that some material 13 may be spattered onto the remaining wafer portions. Whenever a laser is preferably employed as beam generator means 10 a particularly simple scribing or pit creation is possible. Within the general scope of the present invention it is also possible to use a beam generator means emitting an ionized ration or electron beams, instead of a laser.

The material 13 removed from the wafer 11 is preferably exhausted. This is preferably achieved by the provision that the process is performed in vacuum or by means of an exhauster device which exhausts in the vicinity of the scribing region.

The inscription is preferably produced on the edge of the wafer or on the rear side of the wafer. As a result of this provision only a small amount of remaining material or spattering material, respectively, is splashed onto the devices. When a gas jet 23 carries the material removed from the wafer 11 away from the wafer 11, preferably at least during the process of creating the comparatively deep pit 18, one can avoid any contamination of the wafer with a very high efficiency. With this provision the material is prevented from depositing on the wafer in particular. The gas jet preferably flows in a direction towards the wafer edge. Moreover, the gas jet comprises preferably an inert gas. The gas jet is preferably an $N_2$ jet.

When preferably a sacrificial layer 24 is applied on the wafer 11 before the comparatively deep pit 18 is created in the wafer 11, and when preferably the sacrificial layer is subsequently removed there is also an efficient possibility available to keep any contaminating material away from the wafer. The sacrificial layer is preferably removed by a further etching step. The sacrificial layer may preferably be an organic layer or an oxide layer. This layer collects the contaminant or slag, for instance, such as $SiO_x$, thus permitting the removal thereof by removing the sacrificial layer from semiconductor devices prior to the steps of the manufacturing operation. A corresponding sectional view of a wafer with a sacrificial layer 24 applied thereon is illustrated in FIG. 3c.

Any possibly existing residual contaminants 19 and 20, which remain on the wafer 11 as a result of the creation of the comparatively deep pit 18 in the wafer 11 are preferably reduced or removed by a subsequent evaporation step using a second radiation pulse. In this operation the energy density of the second radiation pulse or the parameters of this radiation pulse such as power, energy of the light quanta impinging on the contaminant, etc., are preferably matched so that substantially only the contaminant will be evaporated exclusively.

Moreover, a further radiation pulse is generated as a further step of operation, which, compared against the first radiation pulse, presents a lower energy density and causes the wafer material to commence fusing. Due to this preferred embodiment of the method it is possible to produce very smooth edges between the wafer surface and the pit 18. This is schematically illustrated specifically in FIGS. 2a and 2b. The fused wafer material 14 is represented by undulated arrows.

It is furthermore preferred that a plurality of mutually spaced comparatively deep pits 18 should be created. Moreover, a pit is preferably created by the first radiation pulse and the pit so produced is subjected to the action of the further radiation pulse prior to the creation of another pit 18. In this manner a pit is produced which presents a smooth transition or smooth edge 17, respectively, to the other corresponding pit.

It is preferred that initially all pits are created by the first radiation pulses and that only thereafter all pits are subjected to the action of the further radiation pulses. In this manner it is not necessary to generate two different radiation pulses of different energy densities in alternation; instead initially the scribing is performed with appropriate mimics with deep pits which present comparatively sharp edges 16 whereupon these pits are then converted into pits with smooth edges 17 by means of the respective further radiation pulses.

The depth of the pit preferably amounts to 3 $\mu$m to 10 $\mu$m. The depth of the pit is preferably within the range between 4 $\mu$m and 6 $\mu$m.

The problem of the invention is furthermore solved by a wafer scribing device including a wafer mount 31 and a beam generator means 10 which is used to direct at least one defined beam 12 onto the wafer 11 especially in a wafer region 9 whilst it is possible to generate a radiation pulse by means of which a comparatively deep pit 18 can be created in the wafer 11.

Figure 4:
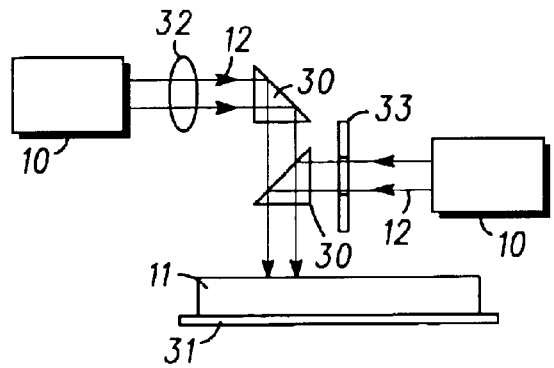
FIG. 4 shows a schematic diagram of a part of a wafer scribing device according to an embodiment of the invention.

One exemplary embodiment of such a wafer-scribing device is schematically illustrated in FIG. 4. This inventive wafer-scribing device presents the advantage that this device can be used to achieve an inscription on wafers in a comparatively simple manner, without any contaminants such as slag in particular depositing on the wafer or with only very slight quantities thereof collecting on the wafer.

Preferably at least one optical element 32 is provided which may be used to focus the radiation pulse. With such focusing it is possible in a simple manner to adjust the energy densities on the wafer surface. The optical element 32 is preferably supported for displacement along the laser beam direction. The beam power emerging from the beam generator means is preferably adjustable so that the energy density or the power density at the wafer site is adjustable, too, which is particularly preferred.

It is furthermore preferably that the beam generator means 10 emits radiation pulses of different power, particularly in alternation, at short intervals. With this provision it is easily and simply possible to create first a pit having a comparatively sharp edge 16, whereupon this sharp edge is rendered smooth. To this end the beam generator means 10 comprises at least two beam generator means emitting radiation pulses of different power levels. This embodiment is schematically illustrated in FIG. 4 in particular. It is furthermore preferred that the beam generator means also includes at least one beam deflector unit 30.

The beam generator means 10 comprises preferably at least one laser. The laser is preferably a YAG laser operating preferably at a wave length of 1,064 nm in particular and having a power level of <1 W. It is particularly preferred that the laser generates a laser pulse at a power level of 0.8 W.

It is moreover preferred that one part of the radiation pulse can be masked out. When a central, specifically circular, fraction of the radiation pulse can be masked out by means of an aperture, which is particularly preferred, it is possible to render only the edge area, i. e. the area of the edge of the pit, smooth selectively.

An installation for the manufacture of semiconductor devices, particularly semiconductor processors, is preferably equipped with a wafer-scribing device of the aforedescribed type.

The process flow illustrated in FIGS. 1a, 1b and 1c furnishes comparatively thin resist thicknesses at the sharp edge 16 of the pit 18. The resist layer is identified by the reference numeral. In some process flows it is possible that the resist 15 breaks up at the sharp edge 16 as a result of the creation of deep trenches. Such breaking-up of the resist 15 during the manufacture of deep trenches is caused by black silicon or corresponding needles, respectively.

In such a case it is advisable to convert the sharp edge 16 into a smooth edge 17, which is realized by means of a second laser pulse having a lower energy density, as is illustrated in FIG. 2a. With this provision a smooth transition is achieved between the pit edge and the wafer plane. To this end laser light is preferably used which is radiated substantially only onto the edge. As a matter of fact, FIG. 2a shows a laser beam which renders the pit 18 smooth over the entire area. It is possible instead, as has been set out above, to employ also some kind of laser light ring. Since as a result of edge smoothing or edge rounding a re-inscription is not necessary costs are saved on account of the shorter process flow.

FIG. 2b shows a corresponding sectional view of a wafer 11 including a deep pit 18 which has already been smoothed or rounded off by the previous step so that a soft edge 17 is shown. A resist 15 is applied on the wafer For the creation of the deep pit the laser is preferably so set that no slag will collect on the wafer, as is shown in FIG. 3a. FIG. 3a is a sectional view of a wafer 11 in which pits 18 are created by means of a laser, with the pits 18 having been created, as a matter of fact, at a comparatively high energy density so that slag or other contaminations from the area of the respective pits will collect on the wafer surface. Here a distinction is made between ejecta slag 19 and crater slag 20. When an optical character recognition (OCR) system is employed the wafer scribing method is preferably so modified that smaller and flatter pits or recesses, respectively, are produced which even though they are invisible to the eye they are yet recognizable by the OCR system.

Moreover, the scribing marking is preferably performed on the extreme wafer edge, preferably between the edge exclusion zone and the edge which is comparatively far away from the region of the active devices. The marking site is, of course, dependent on the mask layout.

The prevention of the creation of the aforementioned defects, i.e. any material or slag possibly collecting in the active region of the devices, results in the advantage that any further cleaning operations are not required after laser scribing. Such cleaning agents are aggressive and might cause damage to or roughen the silicon surface, which may be detrimental to the yield in terms of devices. As such material defects or material depots do not occur with the inventive method such cleaning operations may be avoided, which leads to a shorter operating period and to reduced costs of materials.

The aforedescribed inventive and preferred method is employed particularly preferably for devices produced by a lithographic method, which presents structures of less than 0.18 $\mu$m. This is the case with 300 mm wafers in particular.

Moreover, defects or deposits on the rear side of the wafer or a mount 31 holding the wafer (or a stepper chuck) take an influence on the production of devices. The reason for this is the fact that the wafer flatness is influenced, which is detrimental to the resolution of the lithographic structures on the wafer or the substrate, respectively. The stepper chuck may also be contaminated by particles or materials applied from the rear side of the wafer. This may result in a fault in the structures. Such structural faults, particularly faults in optical structures in lithographic processes, require correction. At present so far not any possibility has been made available to diagnose this problem at all or to remove the defects from the stepper chuck. The wafers produced by the normal scribing methods moreover present irregularities such as bubbles, bumps, and topography-related problems.

Accordingly, a preferred embodiment of the invention is illustrated in FIG. 3b. On account of the modification shown in FIG. 3b some kind of shield is provided, with utilization of a specifically filtered nitrogen jet ($N_2$ jet) which is directed towards the wafer edge for deflection of slag. In a preferred combination with high-performance vacuum pumps or exhauster devices the deflected slag particles or contaminations can be efficiently removed from the surface. The $N_2$ gas jet is so arranged that it produce some kind of gas cushion or gas pad which blocks the surface for slag or deflects slag towards the vacuum, respectively. The angle of the laser may be preferably so oriented that the slag is conveyed towards the vacuum or to the wafer edge.

A corresponding pit presents commonly a diameter of 20 mm to 100 mm. The aggregated pits produce an inscription, which is used particularly for the identification of wafers.

The method is preferably carried out at room temperature.

Figure 5:
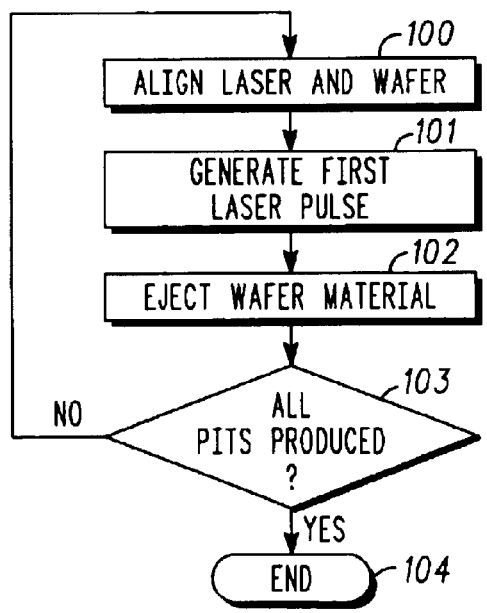
FIG. 5 is a schematic diagram of a preferred method according to the invention.

FIG. 5 shows a schematic diagram of a preferred method according to the invention. In step 100 the laser and the wafer or the laser optics and the wafer are aligned such that it is possible to direct a defined laser beam which is preferably focused onto the wafer surface. In the next step at 101 a first laser pulse is generated. In step 102 the laser pulse is directed to the wafer surface and wafer material is ejected from the wafer. The laser energy density and the length of the pulse is predeterminable and preferably such that the pit which is created due to the ejection of wafer material is deep enough to remain a pit also during the subsequent process steps for the production of semiconductor devices or semiconductor elements.

Preferably the energy density is such that the wafer material is not only ejected from the wafer but also softened or fused in such a manner that a smooth edge is produced.

In step 103 the question arises whether all pits necessary for the scribing or the recognition of the wafer have been produced. If the answer is yes the method ends at step 104. If the answer is no the method again starts at 100, in which the laser and the wafer are aligned again to produce another pit, which is located in the region of the scribing area of the wafer.

Figure 6:
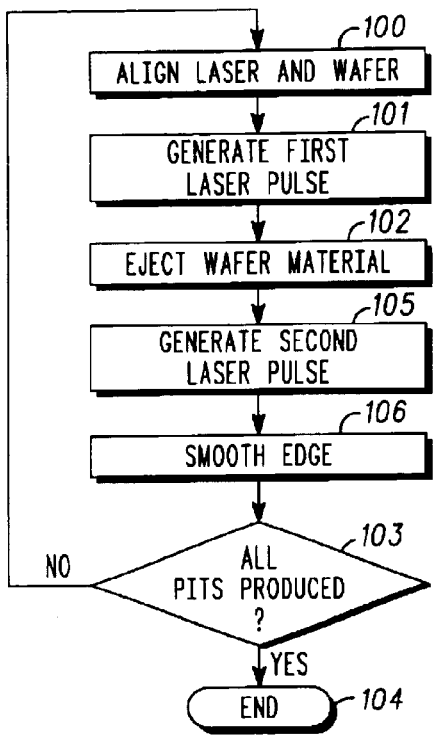
FIG. 6 is a schematic diagram of another preferred method according to the invention.

In FIG. 6 another preferred embodiment according to the present invention is shown. There are two further steps 105 and 106 shown, which are performed within the method steps of FIG. 5. At 105 a second laser pulse is generated and at 106 this laser pulse is directed to the pit or the edges of the pit to smooth the edges. In this embodiment of the invention two laser pulses are used to produce a pit with smooth edges. Each pit is produced sub-sequently. The laser beam energy density or laser-pulse energy density of the second laser pulse is preferably lower than that of the first laser pulse.

Figure 7:
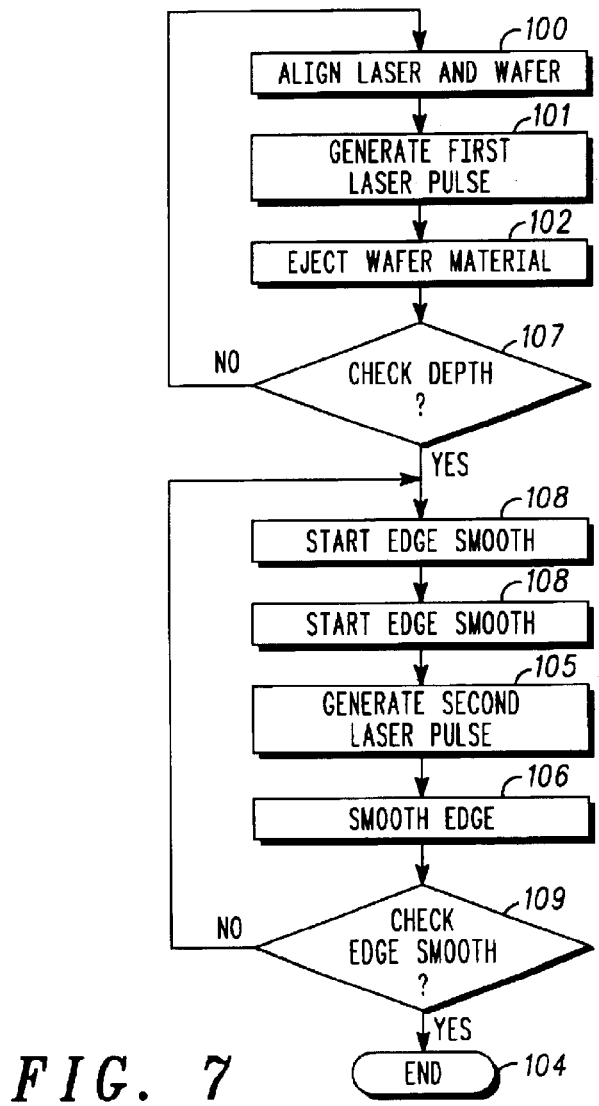
FIG. 7 is a schematic diagram of still another preferred method according to the invention.

FIG. 7 shows still another preferred embodiment of the invention. In this embodiment almost all pits are produced by the first laser pulses at step 101 and 102 and checked in step 107. After all these pits are produced, edge smoothing starts at 108. All edges of the pits are smoothed at steps 105 and 106 and are checked in step 109.

While the invention has been described in terms of particular structures it should be apparent that this invention is not restricted to the embodiments which are described. The invention is not restricted to silicon wafers but may be implemented with other semiconductors or other materials. While the principles of the invention have been described here it is to be clearly understood by those skilled in the art that this description is presented only by way of example and not as a limitation to the scope of the invention. It is accordingly intended that the appended claims should cover all those modifications of the invention which fall within the true spirit and the scope of the invention.

List of Reference Numerals 9 wafer region
10 laser
11 silicon wafer
12 laser beam
13 evaporated silicon
14 fused silicon
15 protective layer (resist)
16 sharp edge
17 smooth edge
18 pit
19 ejecta slag
20 crater slag
21 laser scribe pits
22 gas shield
23 gas jet
24 sacrificial film
30 prism
31 mount
32 lens
33 aperture
100 align laser and wafer
101 generate first laser pulse
102 eject wafer material
103 all pits produced
104 end
105 generate second laser pulse
106 smooth edge
107 check depth
108 start edge smooth
109 check edge smooth

What is claimed is:

1. A scribing method for wafers, comprising:

applying a first radiation pulse to the wafer having a predeterminable energy density that creates a deep pit in said wafer and thereby causes contaminants to be placed onto the wafer; and fusing the contaminants onto the wafer by applying to the wafer a second radiation pulse having an energy density lower than that of the first radiation pulse.

2. The method according to claim 1, wherein the first radiation pulse and the second radiation pulses are laser pulses.

3. The method according to claim 1, characterized in that the depth of said pit is within the range between 3 $\mu$m and 10 $\mu$m.

4. The method according to claim 3, characterized in that the depth of said pit is within the range between 4 $\mu$m and 6 $\mu$m.

* * * * *